United States Patent [19]

Spaulding

[11] 4,130,327
[45] Dec. 19, 1978

[54] ELECTRICAL CONNECTOR HAVING A RESILIENT COVER

[75] Inventor: Tedford H. Spaulding, Norridge, Ill.

[73] Assignee: Bunker Ramo Corporation, Oak Brook, Ill.

[21] Appl. No.: 801,094

[22] Filed: May 27, 1977

[51] Int. Cl.² .............................................. H05K 1/12
[52] U.S. Cl. ............................ 339/17 CF; 339/75 M; 339/176 MP
[58] Field of Search .......... 339/17 CF, 75 RM, 91 R, 339/174, 176 MP

[56] References Cited

U.S. PATENT DOCUMENTS 3,942,854   3/1976   Klein et al. ....................... 339/17 CF

*Primary Examiner*—Roy Lake
*Assistant Examiner*—E. F. Desmond
*Attorney, Agent, or Firm*—William Lohff; F. M. Arbuckle

[57] ABSTRACT

An improved electrical connector is disclosed for mounting and electrically coupling an integrated circuit device to a circuit board. A resilient cover applies pressure at several points on a substrate on which the integrated circuit device is mounted to press the substrate against support surfaces in the connector base. Each of a plurality of flexible electrical contact elements extending from the support surfaces engages a corresponding conductive pad on the substrate with sufficient force to insure good electrical contact between the contact and the pad which is electrically coupled to the integrated circuit device by a conductive path on the substrate.

17 Claims, 11 Drawing Figures

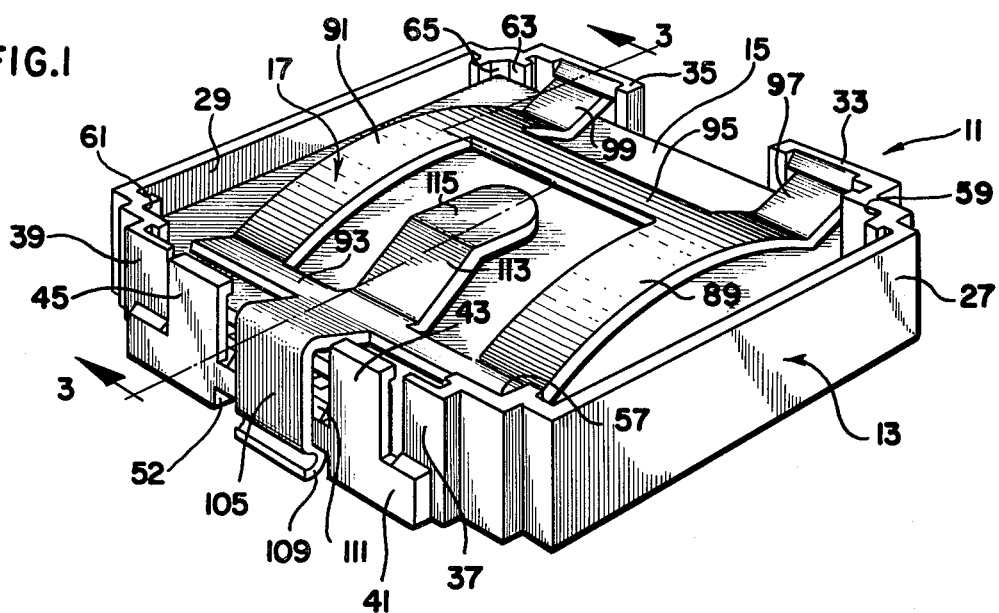
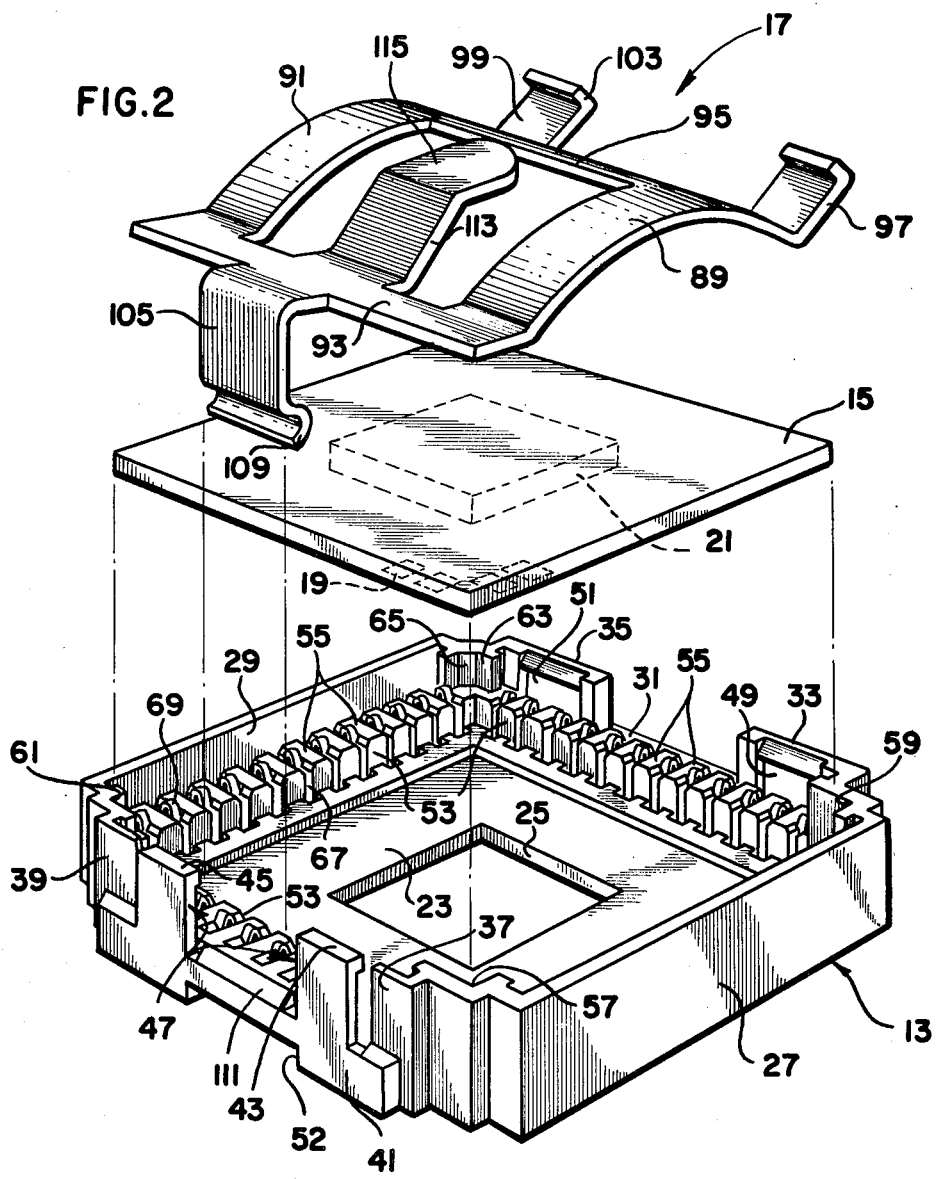

ELECTRICAL CONNECTOR HAVING A RESILIENT COVER

BACKGROUND OF THE INVENTION

This invention relates generally to improved electrical connectors for mounting integrated circuit devices to circuit boards and the like and, more particularly, to electrical connectors having improved covers for pressing the substrates on which the integrated circuit devices are mounted against electrical contacts of the connectors in a manner and with sufficient force to insure good electrical connection between the contacts and conductive pads on the substrate, the pads being electrically coupled to the integrated circuit devices.

Integrated circuit semiconductors, or "chips", as they are often called, are relatively fragile devices which are commonly mounted upon an insulator base. In one common construction, a plurality of relatively thin electrical connector leads project from the base to provide for connection of the device to external circuits. Lead breakage resulting during manufacture and installation or removal of such devices due to the fragile nature of the leads, however, mitigates against their use in many applications, especially in view of their cost.

This problem has been alleviated to a great extent by more recent structures in which the leads are eliminated. In one such structure, the integrated circuit chip is mounted upon a thin, flat, insulator substrate and electrically connected to a plurality of conductive pads provided on the substrate surface immediately adjacent the edges thereof by conductive paths on the substrate. The substrate, in turn, mounts in an electrical connector which serves to connect the integrated circuit device to external circuits on, for example, a printed circuit board.

One type of electrical connector for mounting and electrically connecting an integrated circuit device mounted on a substrate to external circuits is disclosed in U.S. Pat. No. 3,771,109, issued Nov. 6, 1973, to Richard Bruckner, et al., and assigned to Bunker Ramo Corporation, Oak Brook, Ill., the assignee of the present invention. In this and similar prior connectors, the integrated circuit device is initially positioned in an insulator base and then secured therein by a rigid insulator cover. The base includes a plurality of individual metal contacts, one for each conductor pad on the integrated circuit device substrate. These electrical contacts extend above the surface of an interior shoulder in which the contacts are located in contact cavities. When the integrated circuit device is positioned in the base and the cover is closed, the electrical contacts extend from their respective cavities to engage and make electrical contact with the conductive pads and to hold the substrate against the cover, away from the shoulder provided in the base.

The force with which each of the electrical contacts presses against the corresponding conductive pad on the integrated circuit device substrate may vary widely in some connectors due to manufacturing tolerances of the contacts as well as variations in the thickness of the substrate within specified tolerances. This, in turn, may result in less than satisfactory electrical connection between one or more contacts and their corresponding pads and affect the operation of the integrated circuit device.

Moreover, these connectors commonly require at least some tools for mounting or removing an integrated circuit device from the connector.

SUMMARY OF THE INVENTION

The present invention is, therefore, directed to an electrical connector which overcomes the aforementioned problems relating to inadequate contact between the conductive pads on a substrate mounting an integrated circuit device and the electrical contact elements of the connector. The improved electrical connector further eliminates any deleterious effects resulting from variations in size of the several contact elements provided in the connector base and from thickness variations of the substrate and which may result in preventing the conductive pads on the bottom surface of the substrate from engaging the electrical contacts with sufficient force to insure a good electrical connection.

In accordance with the general concepts of the present invention, an improved electrical connector is provided having a base and a resilient cover which presses the substrate downwardly against the support surfaces provided by an interior peripheral shoulder in the base. The electrical contact elements of the base extend upwardly in the shoulder to engage the conductive pads on the bottom surface of the substrate and establish good electrical contact between the conductive pads and their corresponding contacts.

In a first embodiment, the improved cover comprises a unitary, one-piece resilient member having at least one, and preferably, first and second longitudinally extending arcuate portions spaced apart in parallel relation by a pair of integral connecting portions. The arcuate portions are oriented such that when the cover is installed above a substrate in the base, the ends of the arcuate portions contact the substrate at points generally above the support surfaces of the base to press the substrate down thereon uniformly. A hinging portion extends from the rear end of each arcuate portion and through the slot of a corresponding hinge lug of the base. The ends of both hinging portions are upturned to provide feet for engaging the corresponding hinge lug to releasably secure the cover to the base. An integral flange extends forwardly from the front connecting portion and is adapted to extend through an opening provided in the front wall of the base and then downwardly to a point where an inwardly directed catch provided at the end of the integral latching portion snaps into a laterally extending notch at the bottom of the front wall when the cover is in the closed position on the base. A release flange extends rearwardly from the forward connecting portion and is effective, when pressed, to pivot the latching portion around the pivot point established by the forward ends of the arcuate portions and thus release the catch from the notch.

In a second embodiment, the hinging portions of the cover are split into two segments. A first segment of each hinging portion extends through the slot of the corresponding hinge lug as in the first embodiment. The second segment, however, extends above the hinge lug and provides a substantially U-shaped member which engages the back of the hinge lug and cooperates with the foot of the first segment to grasp the lug even when the cover is opened to a vertical position and prevent the cover from disengaging the base. Each hinge lug is configured to abuttingly engage both segments of the corresponding hinge portion and thus stabilize the cover in the open position.

The improved covers employed with the base in the connector of the present invention overcome the problems associated with the prior art devices since the resilient arcuate portions of the cover act to press the substrate down onto the support surfaces of the base into contact with the electrical contact elements. In this manner, the adverse effects caused by variations in the dimensions of the substrate and the contact elements are minimized, and a good electrical contact is more reliably effected between each contact element and the corresponding conductive pad on the bottom surface of the substrate. Moreover, the improved covers hereinafter described in more detail do not require the use of a tool to hinge the cover to the base or to latch the cover in the closed position on the base and similarly do not require a tool to remove or open the cover.

BRIEF DESCRIPTION OF THE DRAWINGS

The novel features that are believed to be characteristic of the invention are set forth in the appended claims. The invention, itself, however, together with further objects and attendant advantages thereof, will be best understood by reference to the following description taken in conjunction with the accompanying drawings in which:

FIG. 1 is a perspective view illustrating an improved electrical connector, including its resilient cover, constructed in accordance with the present invention and having an integrated circuit device mounted therein;

FIG. 2 is an exploded perspective view of the electrical connector shown in FIG. 1;

DETAILED DESCRIPTION OF THE PREFERRED EMBODIMENTS

Figure 3:
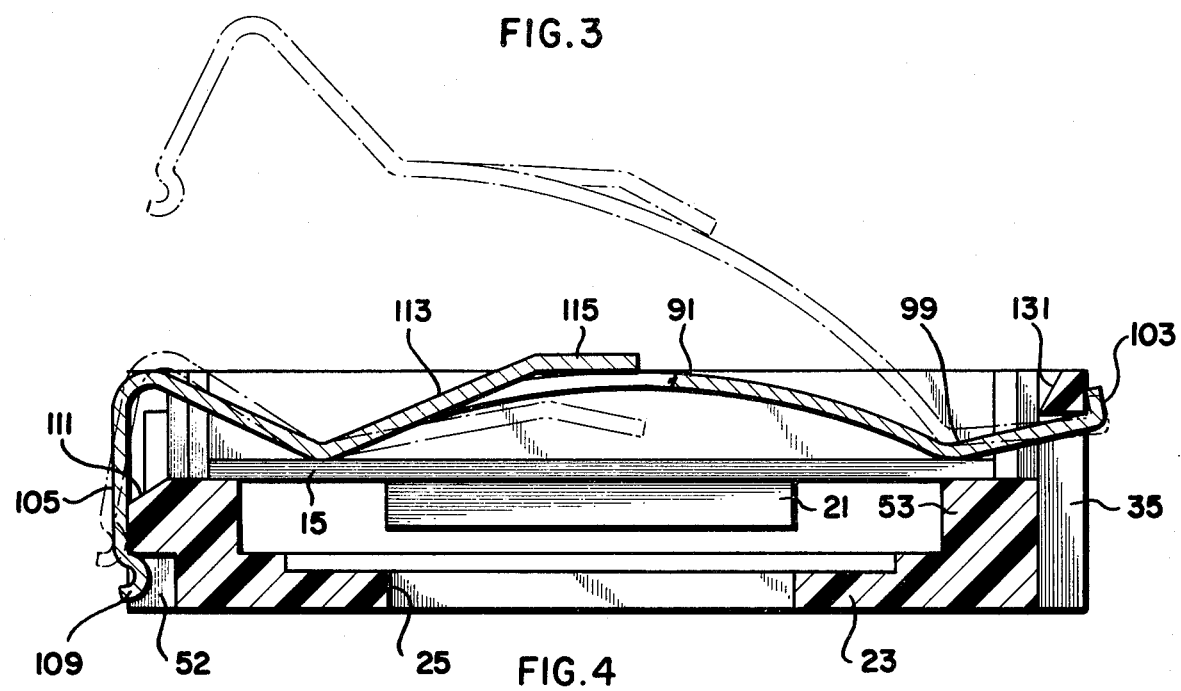
FIG. 3 is a cross-sectional view taken along lines 3—3 in FIG. 1 showing the cover at various stages of closure.
Figure 4:
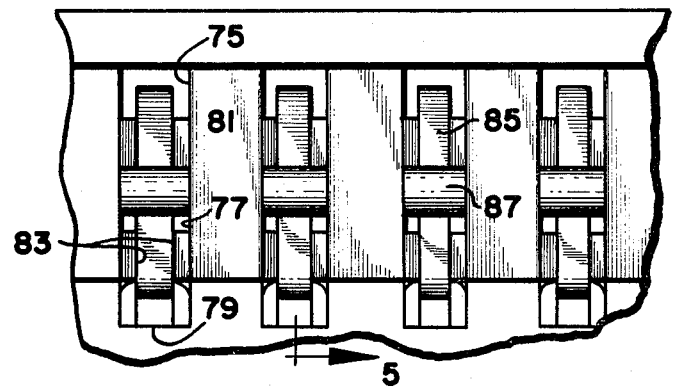
FIG. 4 is a fragmentary top plan view showing the electrical contact elements located in respective contact cavities in the connector base.

Referring now to FIGS. 1 through 6 of the drawings, a first preferred embodiment of the electrical connector 11 of the present invention can be seen to comprise a unitary, one-piece insulator base 13 for receiving a flat substrate 15 bearing an integrated circuit device and a resilient cover 17 for securing the integrated circuit device in the base in good electrical contact with contact elements in the base. In particular, the electrical connector 11 is adapted to mount and electrically connect the integrated circuit device held therein to external circuits on a printed circuit board (not shown) or the like.

Substrate 15 which mounts in the electrical connector 11 generally comprises a thin, flat insulator support member having a plurality of electrically conductive pads 19 provided thereon. As illustrated in FIG. 2, in the present embodiment the substrate 15 is substantially square in shape, and the conductive pads 19 are arranged along each of the four edges of the substrate 15 on its bottom surface. The bottom surface of the substrate 15 is a closely controlled, flat, planar surface and is usually formed from ceramic material, although other materials can be utilized. Since the thickness of the substrate 15 is not critical to the structure or function of the integrated circuit device or of the electrical connector herein described, the thickness of the substrate 19 can vary substantially within specified tolerances. An integrated circuit semiconductor chip 21 is mounted on the bottom surface of the substrate 15 in a generally central location and electrically connected by appropriate conductive paths provided on the bottom surface of the substrate 15 to the conductive pads 19 along the periphery of the substrate. Because the conductor pattern may vary, depending on the nature of the integrated circuit chip 21, only representative pads are shown in the drawings.

The connector base 13 can be molded as a single, one-piece member from any of several resins affording reasonable strength and resilience, but typically, it is molded from a plastic resin material such as glass-reinforced nylon. The particular base 13 shown in the drawings is a standard connector base that has previously been used in conjunction with a conventional rigid cover with the resulting deficiencies heretofore described. When the improved resilient cover 17 of the present invention is substituted, however, the resulting electrical connector 11 exhibits improved electrical connections between the contact elements of the connector and the conductive pads on the integrated circuit device substrate.

In particular, the standard connector base 13 shown in the drawings has a bottom wall 23 having a centrally located cooling aperture 25 extending therethrough and a pair of upwardly extending side walls 27 and 29. A wall 31 extending along the rear of the connector base provides two integral upstanding, spaced apart hinge lugs 33 and 35. The front side of the connector base 13 is generally defined by a compound wall comprising wall portions 37 and 39 having a boss 41 projecting forwardly therefrom. A pair of latching members 43 and 45 extend upwardly from the boss 41 and define a centrally located opening 47 through the front wall of the base.

In prior electrical connectors utilizing this particular base, the cover is a generally flat, rigid, square member sized to close substantially the entire interior of the base from the top side. That cover has a pair of rearwardly extending flanges for engaging slots 49 and 51 through hinge lugs 33 and 35, respectively, and is held in position by the latching members 43 and 45 which snap against its front edge.

Although the cover 17 of the improved electrical connector of the present invention utilizes the hinge lugs 33 and 35 and requires that the opening 47 be provided, it does not utilize the latching members 43 and 45. Rather, the base structure is modified to include a laterally extending notch 52 at the base of the front wall which is used in securing the cover 17 to the base as hereinafter described. Accordingly, it will be understood that the connector base 13 can be modified in accordance with the requirements of the cover 17 utilized in the present embodiment.

The connector base 13 further includes a shoulder 53 which extends along the periphery of the base inside the walls thereof to provide upwardly facing surfaces 55 for engaging and supporting the substrate 15 in the base. The edges of the substrate 15 are aligned over the support surfaces 55 by virtue of the engagement of the substrate with the corners of the connector base 13. As illustrated in the drawings, the corners, identified generally at 57, 59, 61, and 63, are inset to correspond to the dimensions of the integrated circuit device substrate 15 and thus position the device in the base. The corners 57, 59, and 61 are square to receive the correspondingly shaped corners of the substrate 15, but corner 63 has a diagonal wall portion 65 for accommodating a corresponding diagonal corner of the substrate. Accordingly, the diagonal corner of the substrate 15 and corner 63 of the base cooperate to polarize the base 13 and the substrate 15 so that the integrated circuit device is properly oriented when positioned in the base.

A plurality of contact cavities 67 extend downwardly through the base 13 from the upwardly facing support surfaces 55 to mount a plurality of individual metal contact elements 69 inserted therein. Each contact element 69 is inserted downwardly into one of the cavities 67 to project from the bottom of the base 13. As may be seen in FIGS. 5 and 6, where one of the individual contact elements 69 is shown mounted in a corresponding contact cavity 67, the bottom end of the cavity 67 comprises a relatively narrow channel 71 accommodating the shank or pin segment 73 of the contact element 69 and through which the shank 73 extends to below the base 13. The pin segment 73 of the contact element is generally U-shaped in cross-section to afford a rigid connector pin for mounting the electrical connector 11 to a printed circuit board or the like. At its upper end, the cavity 67 includes three relatively wide sections identified from outside to inside by reference numerals 75, 77, and 79, respectively. Opposing barrier walls 81 extend part way into the cavity 67 from both sides thereof to separate cavity sections 75 and 77 while similar opposing barrier walls 83 spaced inwardly from barrier walls 81 separate cavity sections 77 and 79.

Figure 5:
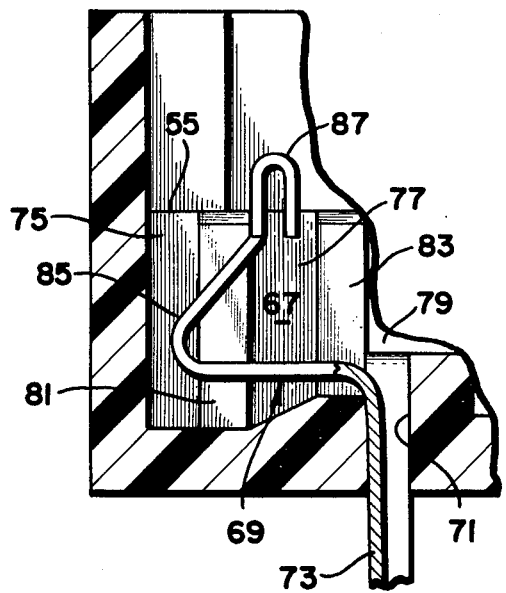
FIG. 5 is a partial cross-sectional view showing the electrical contact element of the connector base in its corresponding contact cavity when the integrated circuit device is not mounted in the connector base.
Figure 6:
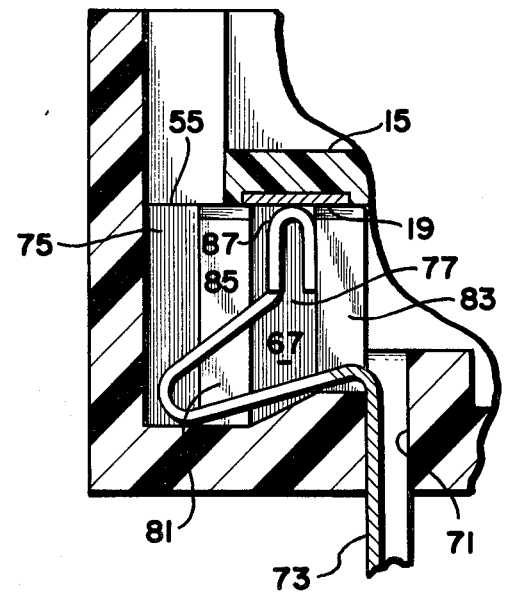
FIG. 6 is a partial cross-sectional view illustrating the engagement of the conductive pad on the integrated circuit device substrate with the electrical contact element of the connector base when the substrate is pressed downwardly by the resilient cover.
Figure 7:
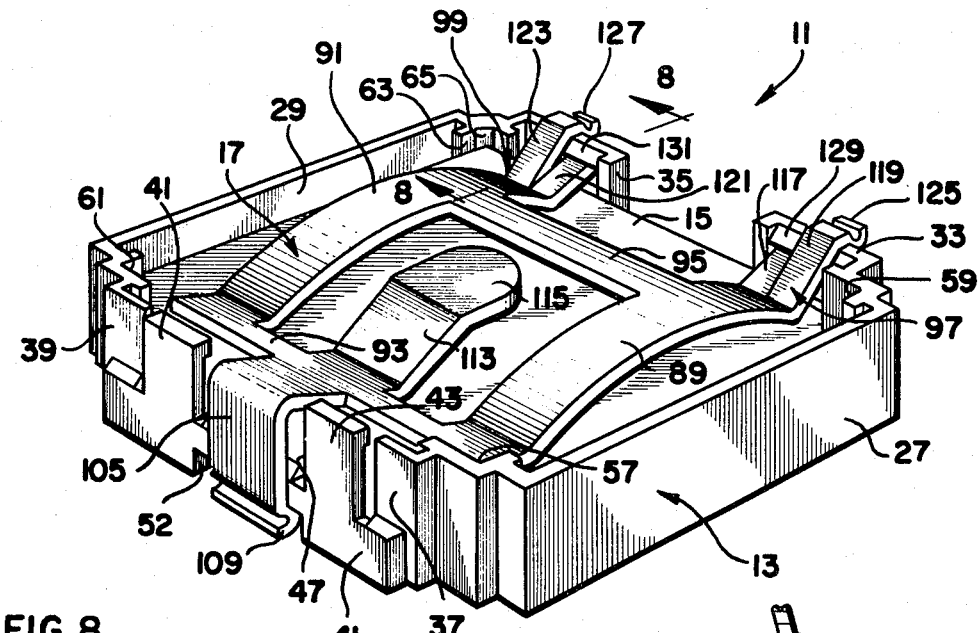
FIG. 7 is a perspective view of an alternative preferred embodiment of the resilient cover showing an integrated circuit device mounted in the electrical connector.
Figure 8:
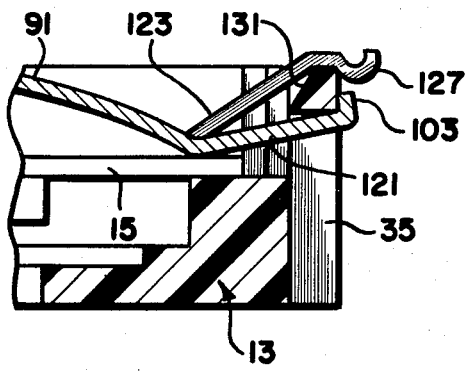
FIG. 8 is a partial cross-sectional view taken along lines 8—8 in FIG. 7 illustrating the alternative cover embodiment in the closed position.
Figure 9:
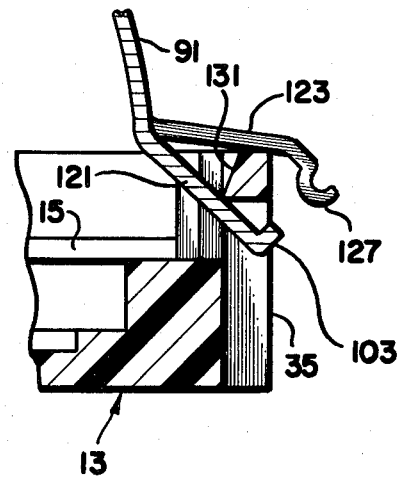
FIG. 9 is a partial cross-sectional view, as in FIG. 8, showing the alternative cover embodiment in a partially opened position.
Figure 10:
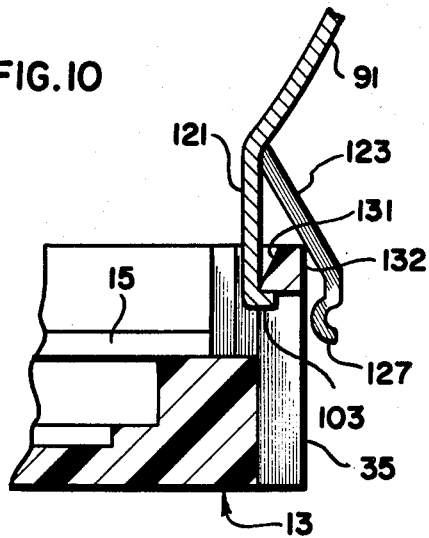
FIG. 10 is a partial cross-sectional view, as in FIG. 8, illustrating the alternative cover embodiment in an open position.

The upper part of contact element 69, as shown in FIGS. 5 and 6, comprises a narrow spring segment 85 that projects outwardly from the shank 73 through cavity sections 75, 77, 79 between barrier walls 81 and 83. The spring contact segment 85 is bent back inwardly in the cavity section 75 at an acute angle and ends in an inverted, substantially U-shaped active contact portion 87 in cavity section 77. The active contact portion 87 is wider than the spring portion 85 and is restrained in cavity section 77 by barrier walls 81 and 83. Contact portion 87 also extends upwardly above the upwardly facing support surfaces 55 when the contact element 69 is not engaged by substrate 19.

The contact elements 69 may be formed of beryllium copper, or of a similar resilient and highly conductive material. The active contact portions 87 of the contact elements may be gold plated to reduce contact resistance. The thickness of the metal of the contact elements may be of the order of 0.006 inch, and the width of the active contact portion 87 may be of the order of 0.025 to 0.03 inch. The unstressed height of the contact element, from the top of the pin segment 73 to the top of the active contact portion 87 may be of the order of 0.15 inch, with other dimensions in approximately the same proportions illustrated in the drawings. These dimensions are not critical and are not to be construed as limitations, except that it is important to proportion the contact elements properly in relation to the resiliency of the metal from which they are formed in order to obtain the operational results herein described.

The embodiment of the improved electrical connector cover 17 shown in FIGS. 1 through 6 is a unitary, one-piece device made from a strong, but resilient, metal or plastic material. In particular, the cover 17 comprises generally a pair of parallel, longitudinally extending arcuate portions 89 and 91 which are maintained in spaced-apart relation by a pair of integral, laterally extending connecting portions 93 and 95. An integral hinging portion 97 extends rearwardly from arcuate portion 89 and slants upwardly to engage and extend through the slot 49 of hinge lug 33, while a hinging portion 99 similarly extends from arcuate portion 91 to engage hinge lug 35. Upturned flanges, or feet, 101 and 103 are provided at the ends of hinging portions 97 and 99, respectively, to engage the hinge lugs and prevent the cover 17 from being accidentally removed from the base 13.

An integral latching flange 105 extends forwardly from connecting portion 93 in alignment with the opening 47 through the front of the connector base 13 and then downwardly toward the laterally extending notch 52 at the bottom of the front wall of the base. Flange 105 ends with an inwardly directed U-shaped flange portion 109 which functions as a catch.

The cover 17 is installed on the base 13 to secure an integrated circuit device therein by orienting the cover to allow the insertion of the hinging portions 97 and 99 into the hinge lugs 33 and 35, respectively. The cover 17 is then pivoted downwardly until the catch 109 engages a camming surface 111 at the foot of the opening 47 through the front wall of the base. Continued downward pressure exerted on the front of the cover 17 forces the catch 109 along the camming surface 11 and over the front wall of the base until the catch portion 109 resiliently snaps into engagement with the notch 52, thus securing the cover 17 in a closed position on the base 13.

A lever 113, extending rearwardly from connecting portion 93 and slanting upwardly to an integral horizontal finger section 115, is also provided to pivotably release the catch 109 from notch 52. That is, when the release lever 113 is pressed, as shown in phantom lines in FIG. 3, the connecting portion 93 of the cover pivots on the top surface of the substrate 15 to disengage the catch 109, allowing the cover 17 to be opened without the use of a tool.

When installed on the base, the cover 17 exerts downward pressure on the top surface of the substrate 15 at the points at which the ends of arcuate portions 89 and 91 make contact with the substrate. Accordingly, the cover resiliently presses the substrate 15 down onto the support surfaces 55. The active contact portions 87 move within the cavity sections 77 and slide across the corresponding conductive pads 19 on the substrate until the active portions 87 are first restrained by the barrier wall 83 and then are depressed downwardly, as illustrated in FIG. 6.

In a second preferred embodiment illustrated in FIGS. 7 through 11, inclusive, the cover 17 previously described is modified by splitting each of the hinging portions 97 and 99 longitudinally into two segments, 117 and 119, 121 and 123, respectively. Segment 117 of hinging portion 97 extends through the slot 49 of hinge lug 33 while the other segment 119 extends over lug 33 and ends in a substantially U-shaped portion 125 which engages the back of lug 33 and cooperates with the foot 101 of the bottom segment 117 to grasp the lug. Similarly, segment 121 of hinging portion 99 extends through the slot 51 of hinge lug 35 and segment 123 extends over the lug. U-shaped portion 127 and foot 103 combine to hold hinge lug 35. Accordingly, the hinging portions 97 and 99 of the second cover embodiment engage their respective hinge lug to pivotally couple the cover 17 to the base 13 even when the cover 17 is rotated to the open position illustrated in FIG. 10. Although the embodiment shown in FIGS. 1 through 6 would be easily removable at such a position, the particular embodiment shown in FIGS. 7 through 11 remains coupled to the base 13. It will be understood, of course, that the cover 17 in FIG. 10 can be removed by flexing the hinging portion segments apart.

Figure 11:
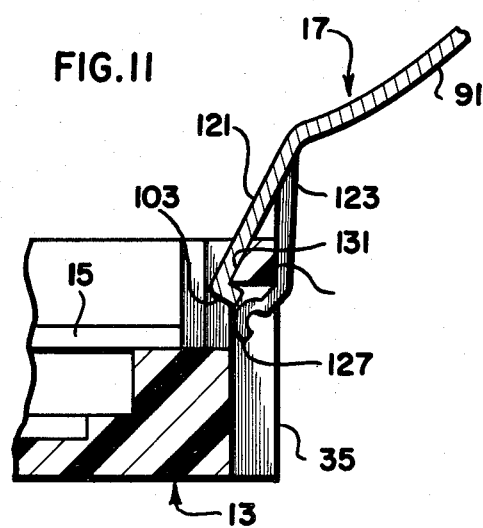
FIG. 11 is a partial cross-sectional view, as in FIG. 8, showing the alternative cover embodiment stabilized in an open position on the connector base.

As further illustrated in FIG. 11, the front surfaces 129 and 131 at the top of hinge lugs 33 and 35, respectively, slant rearwardly to provide the hinge lugs with a cross-section configured to engage both segments of the hinging portion along substantially flat surfaces 131 and 132, simultaneously, thus stabilizing the cover 17 in an open position. It will be appreciated that the second cover embodiment otherwise functions identically to that embodiment shown in FIGS. 1 through 6 to resiliently hold the substrate 15 against the support surfaces 55 of the base such that the electrical contact elements 69 are held in good electrical contact with the conductive pads 19 on the bottom surface of the substrate.

As herein used, including in the appended claims, directional terms such as "bottom", "front", "rear", and the like refer to the particular position of the electrical connector 11 shown in the drawings. It should be understood, however, that this terminology has been employed only for convenience in description, and in fact, connector 11 can be mounted in virtually any desired orientation.

Of course, it should be understood that various changes and modifications to the preferred embodiments described herein will be apparent to those skilled in the art. Such changes and modifications can be made without departing from the spirit and scope of the present invention and without diminishing its attendant advantages. It is therefore intended that such changes and modifications be covered by the following claims.

I claim:
1. An electrical connector for supporting and for completing electrical connections to an integrated circuit device mounted on a flat substrate, said connector comprising:
   base means having outer walls and an interior peripheral shoulder providing upward facing support surfaces for engaging said substrate;
   said base means having hinge lug means on one of said outer walls and means at another outer wall opposite said one outer wall for engaging a catch, said hinge lug means comprising first and second hinge lugs spaced apart to correspond to the spacing between first and second arcuate portions of a resilient cover means, each of said hinge lugs having a slot extending therethrough to define a top hinge lug member above said slot; and
   resilient cover means comprising first and second longitudinally extending arcuate portions having respective opposed ends and at least one laterally-extending connecting portion joining said first arcuate portion and said second arcuate portion in parallel spaced relation,
   each of said arcuate portions having a corresponding hinging portion at one end thereof adapted to engage said hinge lug means, said hinging portions extending rearwardly from said first and second arcuate portions through a corresponding one of said slots in said first and second hinge lugs;
   said cover means further having a latching portion extending forwardly from said connecting portion, said latching portion having catch means adapted to engage said catch engaging means in said opposite wall;
   said cover means being pivotable about said hinge lug means to a closed position wherein said catch means cooperates with said catch engaging means to secure said cover means in the closed position and in which the ends of said arcuate portions contact said substrate and press said substrate down onto said support surfaces.

2. The connector of claim 1 wherein each said hinging portion has a flanged end turned to engage the side of the corresponding one of said hinge lugs away from said arcuate portion when said cover is in the closed position to hold said cover in engagement with said base.

3. The connector of claim 1 wherein each of said hinging portions comprising first and second segments, said first segment of each said hinging portion extending through said slot in said corresponding hinge lug and said second segment extending above said top hinge lug member of said corresponding hinge lug, said first and second segments having opposed flanged ends turned to engage said top hinge lug member to hold said cover on said hinge lug.

4. The connector of claim 3 wherein each of said top hinge lug members is configured to engage said first and second segments so as to stabilize said cover in an upright open position.

5. The connector of claim 1 wherein said opposite wall of said base means has an opening therethrough adapted to receive said latching portion when said cover is moved to the closed position, said latching portion extending through said opening and downwardly along said opposite wall toward said catch engaging means, said catch means comprising a flange extending from said latching portion.

6. The connector of claim 5 wherein said catch engaging means comprises a notch extending laterally across said base means at the bottom edge of said opposite wall.

7. The connector of claim 6 wherein said flange comprising said catch means is a U-shaped flange extending toward said base means to engage said notch when said cover means is assembled on said base means in the closed position.

8. The connector of claim 5 wherein said base means includes a camming surface at the bottom of said opening in said opposite wall for engaging said flange comprising said catch means as said cover is moved to the closed position, said camming surface flexing said flange outwardly to engage and slide on said opposite wall until said flange engages said notch.

9. The connector of claim 1 wherein said cover means includes means for releasing said catch means from said catch engaging means.

10. The connector of claim 9 wherein said connecting portion of said cover means is located adjacent the respective unhinged ends of said first and second arcuate portions, and wherein said catch releasing means comprises a flange extending from said connecting portion opposite said latching portion, said catch releasing flange being depressable to pivot said latch portion away from said base means and release said catch means from said catch engaging means.

11. A resilient, unitary, one-piece cover for pressing and maintaining a substrate bearing an intergrated circuit device into engagement with electrical contact element in a complementary base, said substrate having a plurality of electrically conductive pads electrically coupled to said integrated circuit device and aligned with corresponding ones of said contact elements, said base having first and second hinge lugs on one side and means for engaging a catch on the opposite side, said first and second hinge lugs spaced apart and having a slot extending therethrough to define a top hinge lug member above said slot, said cover comprising;

first and second longitudinally extending arcuate portions having respective opposed ends and at least one laterally-extending connecting portion joining said first arcuate portion and said second arcuate portion in spaced apart relation, each of said arcuate portions having a corresponding hinging portion at one end thereof to engage a corresponding one of said hinge lugs, said hinging portions extending rearwardly from said first and second arcuate portions through a corresponding one of said slots in said first and second hinge lugs, a latching portion extending forwardly from said connecting portion, said latching portion having catch means to cooperate with said catch engaging means in said opposite wall, said cover being pivotable about said hinge lug means to a closed position wherein said catch means cooperates with said catch engaging means to secure said cover means in the closed position and in which the ends of said arcuate portions contact said substrate and press said substrate down onto said base with said contacts engaging said conductive pads.

12. The cover of claim 11 wherein each said hinging portion has a flanged end turned to engage the side of the corresponding one of said hinge lugs away from said arcuate portion when said cover is in the closed position to hold said cover in engagement with said base.

13. The cover of claim 11 wherein each of said hinging portions comprising first and second segments, said first segment of each said hinging portion extending through said slot in said corresponding hinge lug and said second segment extending above said top hinge lug member of said corresponding hinge lug, said first and second segments having opposed flanged ends turned to engage said top hinge lug member to hold said cover on said hinge lug.

14. The cover of claim 13 wherein said top hinge lug members are configured to engage said first and second segments so as to stabilize said cover in an upright open position.

15. An electrical connector for supporting and for completing electrical connections to an integrated circuit device, said connector comprising:

base means for supporting said integrated circuit device;

resilient cover means comprising first and second longitudinally extending arcuate portions, at least one laterallyextending connecting portion joining said first and second arcuate portions, and latching means including a portion extending forwardly from one side connecting portion and terminating in a catch means;

said cover means being engageable with said base in a closed position wherein said catch means cooperates with a catch engaging means on said base to secure said cover means in the closed position and wherein said arcuate portions contact said integrated circuit device and press said device down onto supporting surfaces of said base; and means integral with said cover for releasing said cover from said closed position, said releasing means being depressable to pivot said latch portion away from said base means and release said catch means from said catch engaging means.

16. A resilient, unitary, one-piece cover for pressing and maintaining a substrate bearing an integrated circuit device into engagement with electrical contact elements in a complementary base having first and second hinge lugs and means for engaging a catch, said cover comprising:

first and second longitudinally extending arcuate portions having respective opposed ends and at least one laterally-extending connecting portion joining said first and second arcuate portions in spaced apart relation;

each of said arcuate portions having a corresponding hinging portion at one end thereof to engage a corresponding one of said hinge lugs;

a latching portion extending forwardly from said connecting portion, said latching portion having catch means to cooperate with said catch engaging means to secure said cover means in a closed position wherein said arcuate portions contact said substrate and press said substrate down onto said base; and means integral with said cover for releasing said cover from said closed position, said release means being depressable to release said catch means from said catch engaging means.

17. An electrical connector for supporting and completing electrical connections to an entegrated circuit device, said connector comprising:

base means for supporting said integrated circuit device; and resilient cover means comprising at least one longitudinally extending arcuate portion having opposed ends, a rearwardly extending hinging portion to removably engage said base means, and a forwardly extending latching portion to engage said base means;

said cover means being pivotable on said base means about its hinging portion to a closed position wherein said latching portion engages said base to secure said cover means in the closed position wherein said arcuate portion contacts said integrated circuit device and presses said device down onto supporting surfaces of said base; and said hinging portion having first and second resilient segments which cooperate with and receive a hinge lug member on said base to releasably secure said cover to said base, said resilient segments and said hinge lug member also being configured to maintain said cover in a stabilized open position.

* * * * *